United States Patent
Pham-Van-Diep et al.

(10) Patent No.: US 7,028,391 B2
(45) Date of Patent: Apr. 18, 2006

(54) METHOD AND APPARATUS FOR SUPPORTING A SUBSTRATE

(75) Inventors: Gerald Pham-Van-Diep, Hopkinton, MA (US); John E. Morini, Douglas, MA (US)

(73) Assignee: Speedline Technologies, Inc., Franklin, MA (US)

( * ) Notice: Subject to any disclaimer, the term of this patent is extended or adjusted under 35 U.S.C. 154(b) by 252 days.

(21) Appl. No.: 10/394,814

(22) Filed: Mar. 21, 2003

(65) Prior Publication Data

US 2003/0233750 A1 Dec. 25, 2003

Related U.S. Application Data

(63) Continuation-in-part of application No. 10/175,131, filed on Jun. 19, 2002.

(51) Int. Cl.
*B02P 19/00* (2006.01)

(52) U.S. Cl. ........................ 29/739; 29/281.6; 29/33 K; 29/744; 29/832; 269/266; 269/310

(58) Field of Classification Search .................. 29/719, 29/721, 729, 739, 744, 760, 832, 846, 33 K, 29/743, 746, 559, 281.6; 228/47.1, 49.1, 228/49.5, 55; 269/266, 309–310
See application file for complete search history.

(56) References Cited

U.S. PATENT DOCUMENTS

| 4,088,312 A | * | 5/1978 | Frosch et al. ............... 269/266 |
| 4,759,488 A | | 7/1988 | Robinson et al. |
| 4,807,794 A | | 2/1989 | Hess |
| 4,846,390 A | | 7/1989 | Masuda et al. |
| 4,860,521 A | * | 8/1989 | Ruter ........................... 53/397 |
| 4,892,245 A | | 1/1990 | Dunaway et al. |
| 4,936,560 A | * | 6/1990 | Barozzi ...................... 269/266 |
| 5,092,510 A | * | 3/1992 | Anstrom et al. .............. 228/5.5 |
| 5,152,707 A | | 10/1992 | Dougherty et al. |
| 5,157,438 A | | 10/1992 | Beale |
| 5,320,271 A | | 6/1994 | Bell et al. |
| 5,364,083 A | * | 11/1994 | Ross et al. ................... 269/266 |
| 5,641,068 A | * | 6/1997 | Warner ........................ 206/523 |
| 5,667,128 A | | 9/1997 | Rohde et al. |
| 5,794,329 A | | 8/1998 | Rossmeisl et al. |
| 5,984,293 A | | 11/1999 | Abrahamson et al. |
| 6,131,793 A | | 10/2000 | Howell |
| 6,264,187 B1 | | 7/2001 | Hertz et al. |

OTHER PUBLICATIONS

*International Search Report for PCT/US03/19483 mailed Oct. 17, 2003.

* cited by examiner

*Primary Examiner*—Minh Trinh
*Assistant Examiner*—Donghai D. Nguyen
(74) *Attorney, Agent, or Firm*—Lowrie, Lando & Anastasi, LLP

(57) ABSTRACT

An apparatus for performing operations on at least one surface of an electronic substrate having a first surface and a second surface includes a frame, a transportation system that moves the substrate through the apparatus, a substrate support system, coupled to the frame, having a non-rigid portion that contacts and supports the substrate during an operation on the substrate, wherein the non-rigid portion allows flexure of the substrate before and during the performance of an operation on the substrate, and a device coupled to the frame that performs an operation on a surface of the substrate.

4 Claims, 5 Drawing Sheets

METHOD AND APPARATUS FOR SUPPORTING A SUBSTRATE

RELATED APPLICATIONS

This application is a continuation in part of U.S. patent application Ser. No. 10/175,131 filed Jun. 19, 2002, which is incorporated herein by reference.

FIELD OF THE INVENTION

The invention relates to apparatus and methods for processing substrates such as circuit board assemblies, and more specifically to apparatus and methods for supporting a circuit board during the printing of solder paste on the circuit board, dispensing of material on the circuit board, placing of components on the circuit board, or some other operation.

BACKGROUND OF THE INVENTION

The manufacturing of circuit boards involves many processes, one of which is surface mounting electrical components to the circuit boards. To surface mount components to a first surface of a circuit board, a dispenser deposits solder paste or adhesive onto the first surface of the circuit board, and then components are pressed against the solder paste or adhesive. After the first side of the circuit board has been populated with components, the board is inverted and the process is repeated to surface mount components to the second side of the board. The solder paste dispenser is typically a stenciling machine, and typically a turret-type device presses the components into the solder paste or adhesive.

When a circuit board is subjected to these manufacturing processes, it is often desirable to uniformly support the lower surface of the board so that the upper surface remains in substantially the same plane while a force is applied to the topside of the circuit board. Known means of supporting a circuit board during manufacturing operations are described in Beale, U.S. Pat. No. 5,157,438; Rossmeisl, U.S. Pat. No. 5,794,329; Barozzi, U.S. Pat. No. 4,936,560; Dougherty, U.S. Pat. No. 5,152,707; and Hertz, U.S. Pat. No. 6,264,187.

SUMMARY OF THE INVENTION

In general, in one aspect, the invention provides an apparatus for performing operations on a surface of an electronic substrate. The apparatus includes a frame, a transportation system that moves the substrate through the apparatus, a substrate support system, coupled to the frame, having a non-rigid portion that contacts and supports the substrate during an operation on the substrate, wherein the non-rigid portion allows flexure of the substrate before and during the performance of an operation on the substrate, and a device coupled to the frame that performs an operation on a surface of the substrate.

Implementations of the invention may include one or more of the following features. The support system of the apparatus can be moveable from a lowered position to a raised position such that in the raised position, the non-rigid portion contacts a side of the electronic substrate. The non-rigid portion can be pressurized air released from cylinders that support the substrate in a position above the cylinders. Alternatively, the non-rigid portion can be foam, or the non-rigid portion can be a sponge.

Further implementations of the invention may include one or more of the following features. The device can be a stencil and the substrate can be a circuit board. The non-rigid portion can contact the underside of the circuit board and conform to the topography of the circuit board.

In general, in another aspect, the invention provides a method of performing an operation on an electronic substrate. The method includes loading the substrate into a processing machine, moving a support system to a position below the electronic substrate, contacting a side of the substrate with a member of the support system, wherein the contacting member yields to the substrate, performing a manufacturing operation on the substrate, and removing the substrate from the processing machine.

Further implementations of the invention may include printing solder paste on the electronic substrate, wherein a stencil and a squeegee are used to accomplish printing. The support system can be returned to a home position after the substrate is removed from the processing machine. The substrate can be held in a substantially non-planar orientation for the duration of the contact by the support system, and the substrate can be allowed to flex in reaction to a force applied to the substrate during a manufacturing operation. Further, pressurized air can be released from cylinders in the direction of the substrate to support the substrate. Also, the electronic substrate can be set on foam while performing the manufacturing operation.

Generally, in another aspect, the invention provides an apparatus for supporting an electronic substrate during a manufacturing operation. The apparatus includes a frame and supporting means, coupled to the frame, for non-rigidly supporting electronic substrates, wherein the means for non-rigidly supporting allow flexure of the electronic substrate before and during the manufacturing operation.

Implementations of the invention may include one or more of the following features. The apparatus can include means for moving the supporting means from a position in contact with the electronic substrate to a position removed from the electronic substrate. The apparatus can include a stencil and a squeegee for depositing solder paste onto the substrate.

The invention will be more fully understood after a review of the following figures, detailed description and claims.

BRIEF DESCRIPTION OF THE FIGURES

For a better understanding of the present invention, reference is made to the drawings which are incorporated herein by reference and in which.

DETAILED DESCRIPTION OF PREFERRED EMBODIMENTS

Embodiments of the present invention are described below with reference to screen printers or stencil printers that print solder paste onto circuit boards. As understood by those skilled in the art, embodiments of the present invention can be used with electronic substrates other than circuit boards, such as electronic components, and with machines other than screen printers such as pick and place machines or dispensing machines.

Figure 1:
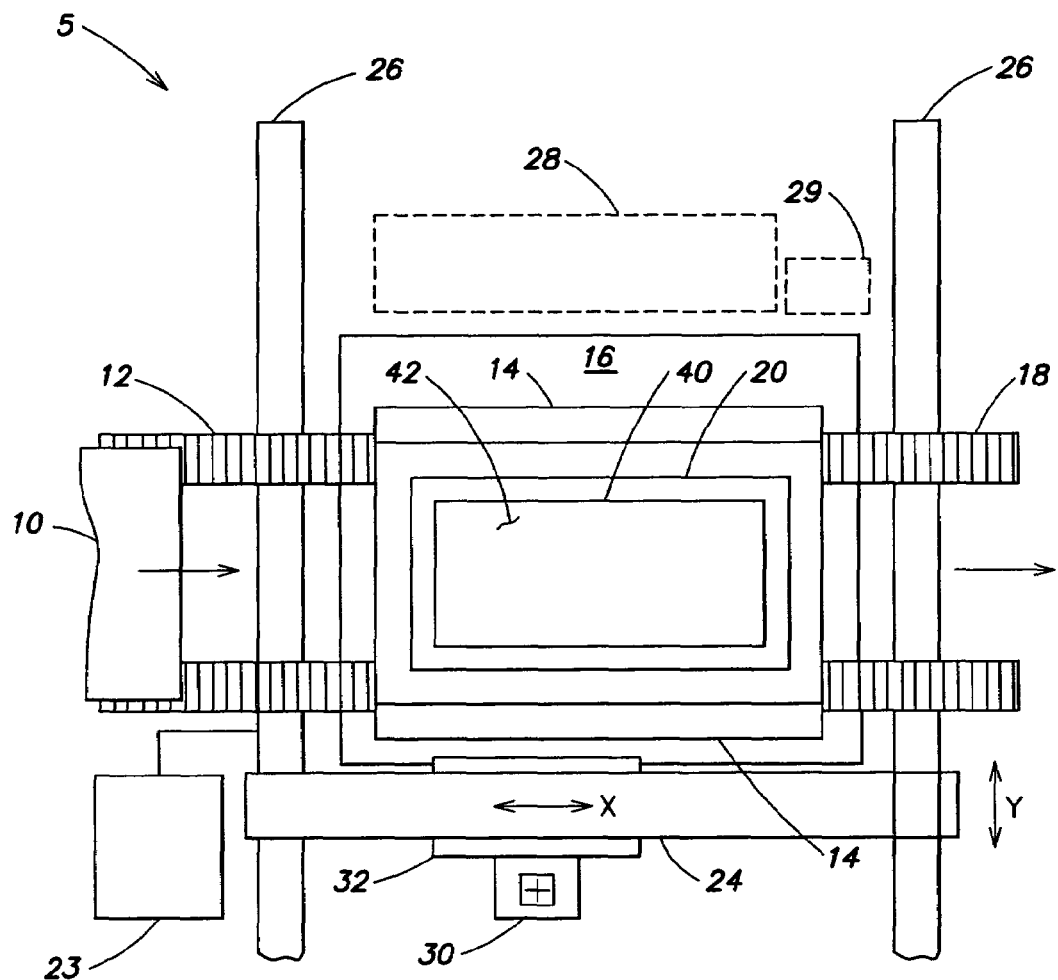
FIG. 1 is a top view of a printing apparatus in accordance with one embodiment of the invention.

Referring to FIG. 1, internal components of a printer 5 in accordance with one embodiment of the invention that applies solder paste to circuit boards are shown. The printer is an improvement over screen printers described in U.S. Pat. No. 5,794,329, which is hereby incorporated by reference.

As shown in FIG. 1, the printer 5 includes a tractor feed mechanism 12, edge tractor mechanisms 14, a rigid support table 16, a board support mechanism 20, a moveable gantry 24, a controller 23, a squeegee/adhesive applicator 28, and a camera 30 carried on a carriage 32. The support mechanism 20 is located on and attached to the support table 16. The camera 30 carried on the carriage 32 is moveable along the gantry 24 in a linear X-axis of motion. The gantry 24 is moveable along tracks 26 in a linear Y-axis of motion. The squeegee/adhesive applicator 28 is attached to the printer 5 in a position above the level of the circuit board 10.

Circuit boards 10 fed into the printer 5 usually have a pattern of pads or other, usually conductive surface areas onto which solder paste will be deposited. When directed by the controller of the printer, the tractor feed mechanism 12 supplies circuit boards 10 to a location where the camera 30 records an image of the circuit board 10. The image is sent to the controller, which signals for the edge tractor mechanisms 14 to shuttle the circuit board 10 to a second location over the rigid support table 16, beneath a solder stencil. Once arriving at a position over the support table 16, the circuit board 10 is in place for a manufacturing operation. To successfully perform operations on the circuit board 10, the circuit board 10 is supported by the support mechanism 20. The support mechanism 20 is raised from beneath the circuit board 10 at the direction of the controller. When the solder stencil and the circuit board 10 are aligned correctly, the stencil is lowered toward the board 10 for application of the solder paste or the circuit board can be raised toward the stencil by the support mechanism. The squeegee/adhesive applicator 28, positioned above the circuit board 10, is shown in phantom in FIG. 1. The adhesive applicator 28 can vary the amount of solder paste or adhesive delivered on the stencil and applied by the squeegee. The squeegee 28 wipes across the stencil, thereby pushing solder paste through the stencil onto the circuit board 10. After solder paste has been deposited on the circuit board 10, the support mechanism 20 moves downward away from the position of the circuit board, under control of the controller. The controller then controls movement of the circuit board 10 to the next location using the tractor mechanism 18, where electrical components 11 will be placed on the circuit board.

As discussed, the circuit board 10 enters on the tractor feed mechanism 12 and stops when in a position over the table 16 where deposition of solder paste will occur. Throughout the process of printing the solder paste on the circuit board 10, a force is applied to a top surface of the board 10 by the squeegee. In order for the solder paste to be applied evenly, the circuit board 10 is supported using the support mechanism 20 to oppose the force being applied to the topside of the circuit board 10. The support mechanism is attached to the printer above the surface of the table 16. The support mechanism 20 includes a non-rigid supporting body that contacts the board 10. The support mechanism may include, for example, a deformable material 42 in a support bed 40, wherein the deformable material is the portion of the support mechanism in close proximity to the circuit board 10. Alternatively, the support mechanism 20 may be a deformable or non-rigid material that need not be contained in a support bed, such as a foam or a sponge. The support mechanism 20 can be a plurality of air cylinders that release pressurized air in the direction of the circuit boards, whereby the air contacts the surface of the circuit board 10 and holds it in position during printing.

The entire support mechanism 20 is attached to the printer frame in such a way that it can be raised to the surface of the circuit board 10, allowing the non-rigid support to contact the underside-topography of the board 10 during printing. The support mechanism 20 can alternatively be designed to stay in position while the circuit board is moved toward the support mechanism 20. When the support mechanism 20 is moved to position under the board, the support system evenly supports the underside of the circuit board 10 due to the ability of the non-rigid member to conform to the topography of the circuit board 10, or to yield with the circuit board 10 when an added force is applied to the circuit board 10.

Figure 2A:
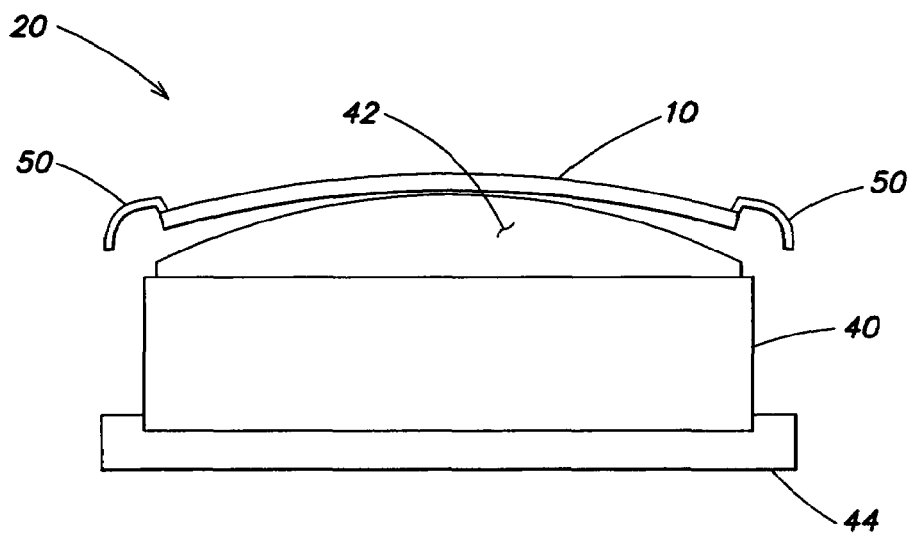
FIG. 2A is a schematic diagram of a non-rigid support mechanism in a preparation stage in accordance with one embodiment of the invention.
Figure 2B:
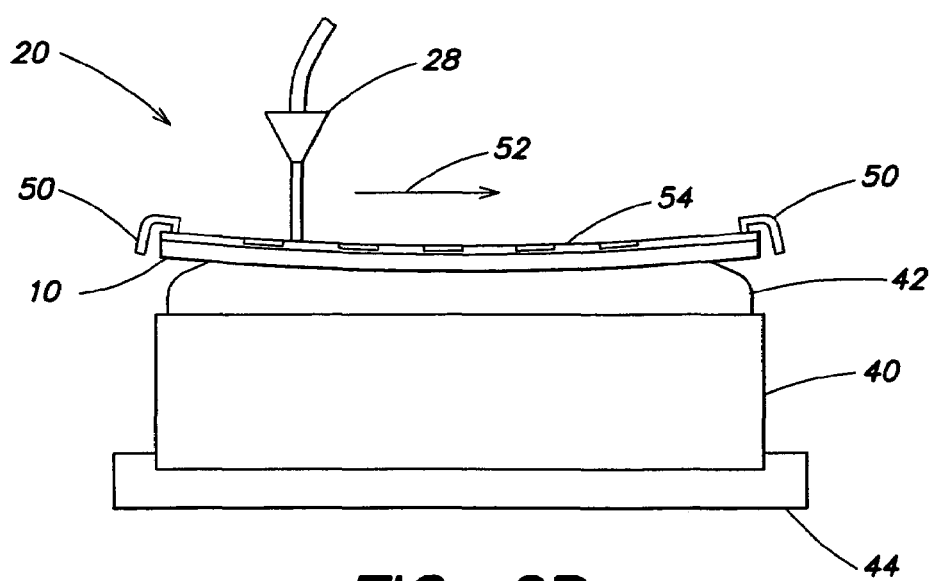
FIG. 2B is a schematic diagram of a non-rigid support mechanism in a loaded stage in accordance with one embodiment of the invention.

Referring to FIGS. 2A and 2B, the support mechanism 20 is shown in more detail. The support mechanism includes a base 44, a housing 40, and a non-rigid component 42. Specifically, FIG. 2A shows the support mechanism 20 in a raised position, contacting the circuit board 10, which is held in place using board clamps 50. FIG. 2B shows the squeegee 28 being moved across the stencil and the circuit board in the direction defined by arrow 52. Due to the non-rigidity or elasticity of the top body of the support mechanism, the circuit board 10 is allowed a degree of flexure such that it may bow or bend slightly. The circuit board 10, held in position by the board clamps 50, can arch over the non-rigid top body of the support mechanism while being held in position for a process to be performed on its surface. In FIG. 2B, the squeegee 28 makes contact with the surface of a stencil 54 positioned over the board 10, thereby applying pressure to the board. The squeegee moves in the direction of arrow 52. The force applied by the squeegee 28 will work to sufficiently and evenly spread solder paste onto the circuit board 10 by causing the position of the board to become substantially planar, or to bow in the opposing direction, as is portrayed in FIG. 2B. The circuit board 10 and the stencil 54 yield to the force from the squeegee 28, rather than being held in a fixed planar and rigid orientation.

Figure 3A:
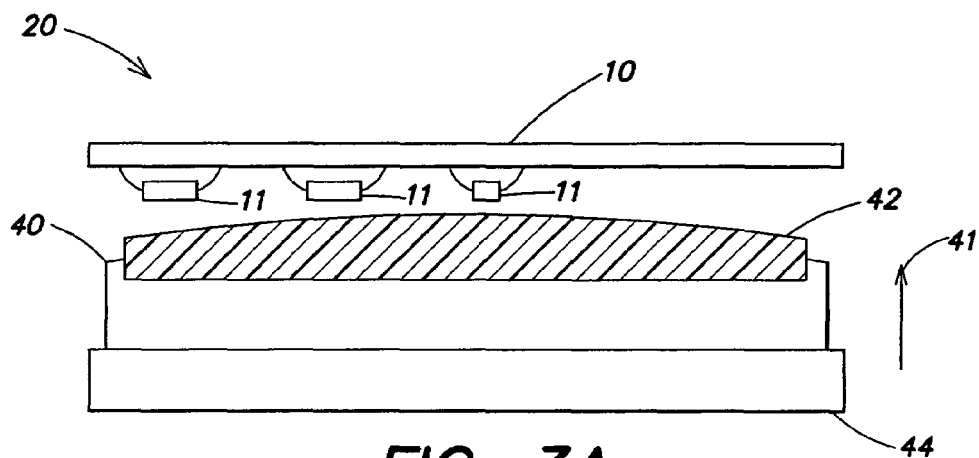
FIG. 3A is a schematic diagram of support gel in a preparation stage in one embodiment of the invention.
Figure 3B:
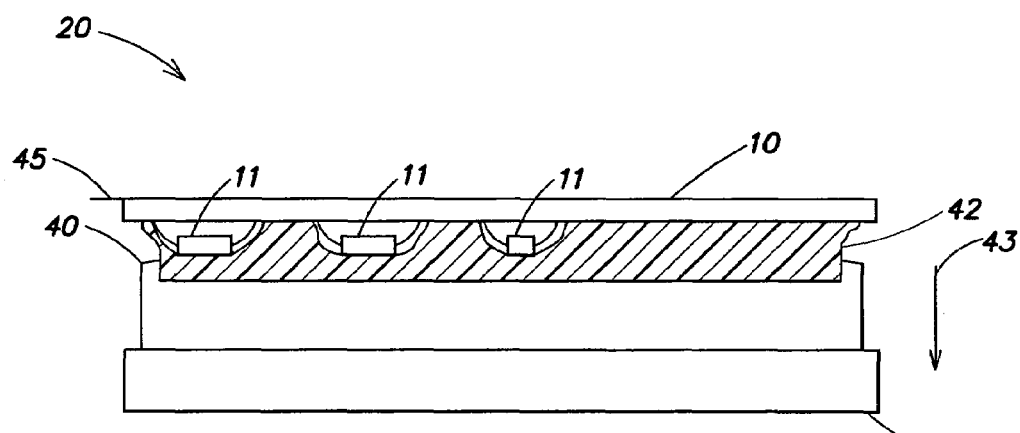
FIG. 3B is a schematic diagram of support gel in a conformed stage in one embodiment of the invention.
Figure 3C:
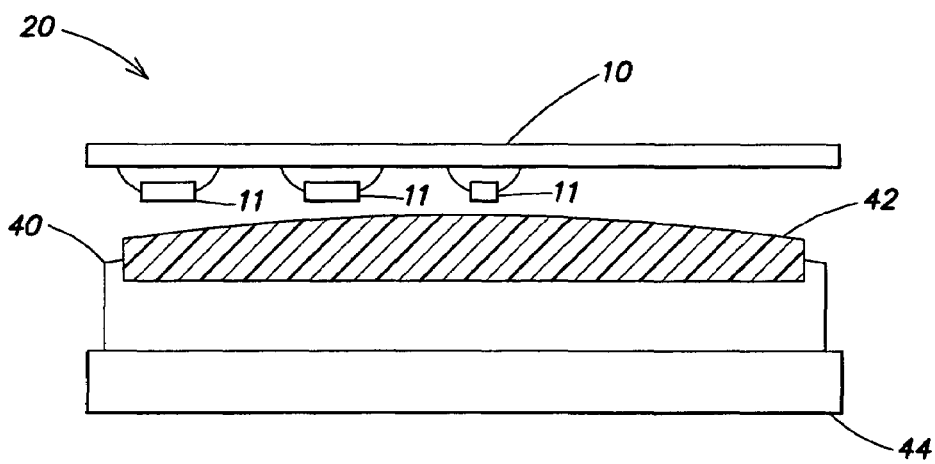
FIG. 3C is a schematic diagram of support gel in a post-loaded stage in one embodiment of the invention.

Referring to FIGS. 3A–3C, a particular embodiment of the support mechanism 20 is shown in greater detail. In one embodiment, the non-rigid support 42 is a low durometer gel contained in the housing 40, which functions as a support bed for containing the gel. The low durometer gel 42 is a polyurethane gel, manufactured and distributed by Northstar Polymer, LLC, located in Minneapolis, Minn. under part no. MPP-V37A. In FIG. 3A, the support mechanism is shown moving in the direction of arrow 41 toward a circuit board 10 to support the board 10 in the printer 5. The underside of the circuit board is populated with electrical components 11.

FIG. 3B shows the support mechanism 20 having a low durometer gel in contact with the board 10 after a print operation has occurred. In FIG. 3B, a stencil 45 is still in contact with the board 10. Under compression caused by the contact of the gel 42 with the board 10, the gel 42 conforms to the underside topography of the circuit board 10, as shown in FIG. 3B, to provide evenly distributed support to the circuit board 10. The gel 42 is of a consistency such that it remains contained within the housing 40 even while under compression. Controlled by the controller, the gel 42 and support bed 40 are retracted from the surface of the board 10 in the direction of arrow 43 at the completion of processing the circuit board 10, and the entire support mechanism 20 returns to a home position, shown in FIG. 3C, where it will remain until the next circuit board 10 is aligned for processing. As shown in FIG. 3C, the low durometer gel 42 returns to a relaxed state when the support mechanism 20 is in the home position. The low durometer gel 42 is then ready to conform to a board topography during a next print cycle.

Figure 4A:
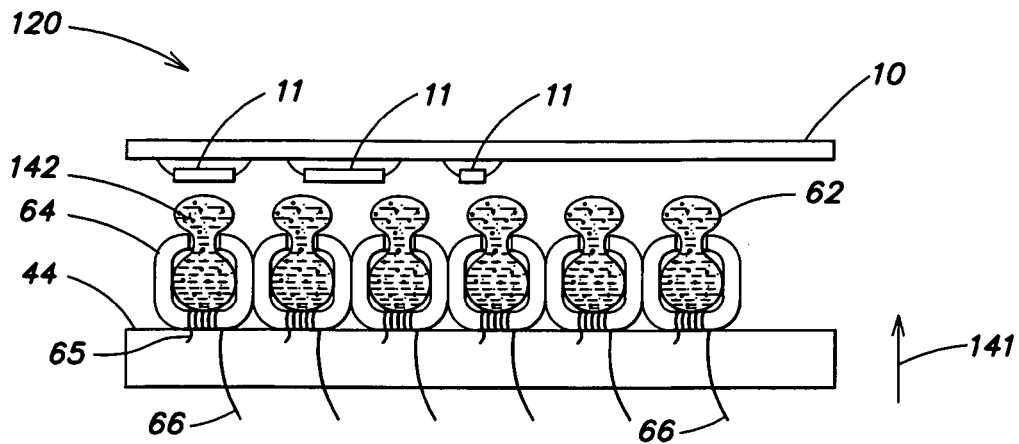
FIG. 4A is a schematic diagram of rheomagnetic fluid in a pre-energized phase in one embodiment of the invention.
Figure 4B:
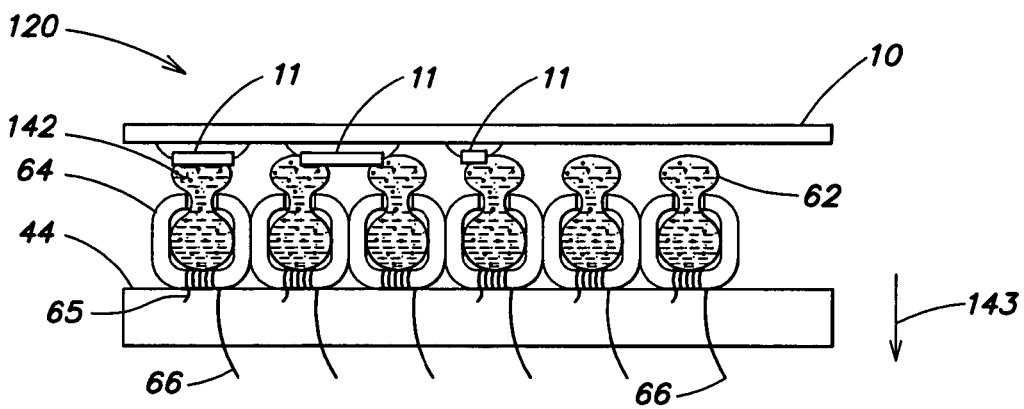
FIG. 4B is a schematic diagram of rheomagnetic fluid in a loaded phase in one embodiment of the invention.
Figure 4C:
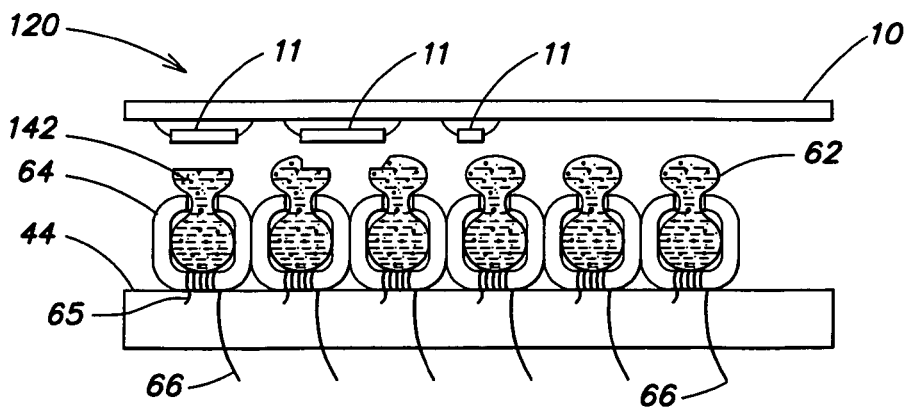
FIG. 4C is a schematic diagram of rheomagnetic fluid in an energized phase in one embodiment of the invention.
Figure 5:
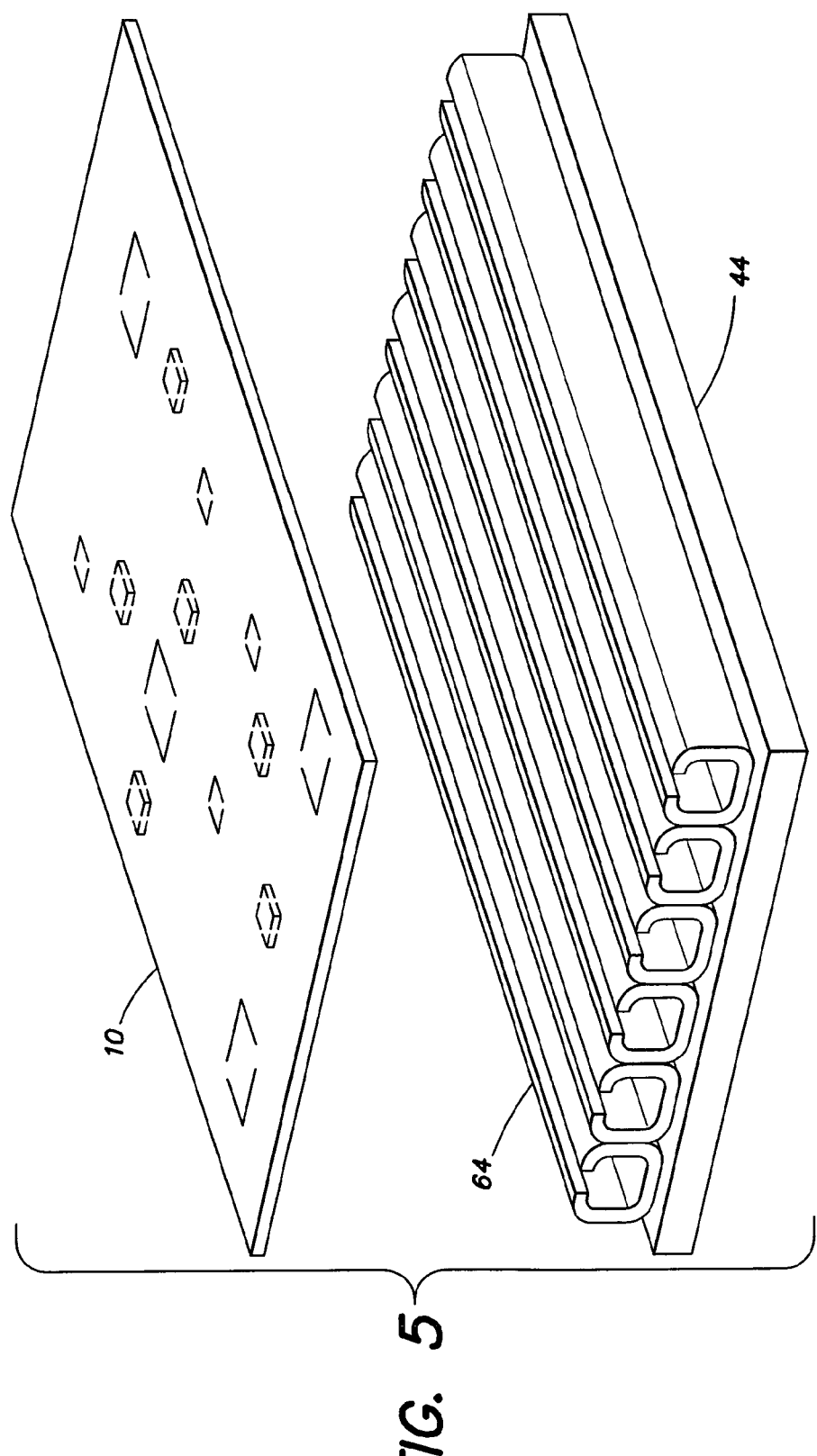
FIG. 5 is a schematic diagram of a top view of the rheomagnetic fluid support system in one embodiment of the invention.

Alternatively, in another embodiment of the invention, which will now be described with reference to FIGS. 4A–4C and FIG. 5, a support mechanism 120 may be used to support a circuit board during printing in place of support mechanism 20, previously described. The support mechanism 120 includes a base 44, electromagnetic cavities 64, magnetic windings 65 and a deformable material 142. The deformable material 142 is a rheomagnetic fluid contained in thin-walled tubes 62, which may be made of latex, that are partially disposed in the electromagnetic cavities 64. In one embodiment, the rheomagnetic fluid is a mixture of small magnetic particles such as iron, and a viscous fluid such as oil or water, manufactured and available from Lord Corporation of Cary, N.C. under part nos. including MRF-132AD, MRF-132LD, MRF-241GS, MRF-240B5 and MRF-336AG. In one embodiment, the electromagnetic cavities are made of a magnetic material, such as iron. Common magnetic windings 65 line the base of the electromagnetic cavities 64. The electromagnetic cavities 64 are attached via connecting wires 66 to a source that provides electric current under control of the controller. As shown in FIG. 5, the electromagnetic cavities 64 can be aligned across the length of the base 44 of the support mechanism 120.

The support mechanism 120 operates as follows. A circuit board 10, having an underside populated with electrical components 11, is positioned over table 16 for the deposition of solder paste. The support mechanism 120 is moved under the control of the controller in the direction of arrow 141 until the rheomagnetic material contacts the underside of circuit board 10. While the support mechanism 120 approaches the underside of circuit board 10, the rheomagnetic fluid 142 is in a free, or relaxed state. In the relaxed state, the rheomagnetic fluid 142 easily conforms to the topography of the board 10 upon contact with the board 10. While the rheomagnetic fluid 142 is in contact with the board 10, the electromagnetic cavities 64 are energized with an electric current via connecting wires 66, which are also connected to a DC power source. The magnetic field is proportional to the direction and intensity of the electric current in the magnetic winding 65. Enough current must be provided to generate a magnetic field strong enough to align the particles in the rheomagnetic fluid 142. Energy from the electromagnetic cavities 64 transforms the tubes 62 of rheomagnetic fluid 142 from a fluid state to a rigid state. While in the rigid state, the rheomagnetic fluid 142 provides sufficient board support during manufacturing operations.

The configuration of the rheomagnetic fluid 142 when energized is such that it rigidly supports the surface of the board 10, whether the board 10 is populated with electrical components or not. The rheomagnetic fluid 142 will remain energized, or in a rigid state for as long as the electromagnetic cavities 64 remain energized with an electric current as shown in FIG. 4C. The rheomagnetic fluid remains energized in a shape conforming to a first circuit board 10 so that many circuit boards 10 having the same topography as the first circuit board 10 can be mass-produced without de-energizing and re-energizing the rheomagnetic fluid 142. Upon completion of processing of a board 10, the controller directs the support mechanism 120 to the lowered position in the direction of arrow 143.

If it is desired to process a second type of board, the electromagnetic cavities 64 are de-energized, thereby returning the rheomagnetic fluid 142 to a fluid state. The system resets for another print cycle when the support mechanism 120 is returned to a home position. The rheomagnetic fluid 142 is re-configured to support another set of circuit board assemblies with a different configuration of electrical components 11 by pressing the rheomagnetic fluid against the undersurface of a new circuit board 10 and energizing the electromagnetic cavities 64 with electric current once again.

In the embodiments of the present invention described above, the low durometer gel when used as the non-rigid support fills the housing container completely. As understood by those skilled in the art, other configurations may include strips of low durometer gel contained in the support housing, or other appropriate and strategic configurations of the gel that amply support the underside of the circuit board.

In embodiments of the present invention described above, the rheomagnetic fluid used as a deformable material is contained in an assembly of electromagnetic cavities, all of which comprise the support system. As understood by those skilled in the art, other configurations may include a single electromagnetic cavity containing rheomagnetic fluid such that the single container of rheomagnetic fluid is sufficiently energized to conform to the surface of the boards. The assembly of electromagnetic cavities may further be aligned across the width of the base of the support mechanism. In still further embodiments of the present invention, a connecting wire is attached to each of the electromagnetic cavities to provide electric current that energizes the electromagnetic cavities, which thereafter energizes the rheomagnetic fluid to make it rigid. As understood by those skilled in the art, other configurations may include a single set of connecting wires that provides electric current to all of the electromagnetic cavities in the assembly.

In still further embodiments of the present invention, the support mechanism is attached to the printer frame so that it moves in an upward direction toward the underside of the circuit board during manufacturing, when directed by the controller. As understood by those skilled in the art, other configurations may include a support mechanism in a fixed position whereby the boards are lowered to the deformable material of the support mechanism during manufacturing.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An apparatus for performing operations on at least one surface of an electronic substrate having a first surface and a second surface, the apparatus comprising:
   a frame;
   a transportation system that moves the substrate through the apparatus;
   a substrate support system, coupled to the frame, having a supporting housing and a non-rigid portion comprising a low durometer gel that contacts and supports one of the first surface and the second surface of the substrate during an operation on the substrate, wherein the low durometer gel is contained in the supporting housing and conforms to the one of the first surface and the second surface of the substrate during the performance of an operation on the substrate and resumes to a relaxed state after performance of an operation on the substrate upon transferring the substrate from the apparatus; and
   a device coupled to the frame that performs an operation on the other of the one of the first surface and the second surface of the substrate.

2. The apparatus of claim 1 wherein the support system is movable from a lowered position to a raised position, wherein the low durometer gel contacts the one of the first surface and the second surface of the substrate.

3. The apparatus of claim 1, wherein the device is a stencil and the substrate is a circuit board.

4. The apparatus of claim 3, wherein the low durometer gel contacts an underside of the circuit board and conforms to a topography of the circuit board.

* * * * *